United States Patent
Tomiye et al.

(10) Patent No.: US 7,061,054 B2
(45) Date of Patent: Jun. 13, 2006

(54) SEMICONDUCTOR DEVICE AND SEMICONDUCTOR DEVICE MANUFACTURING METHOD

(75) Inventors: Kanna Tomiye, Chigasaki (JP); Akira Hokazono, Sagamihara (JP); Kazunari Ishimaru, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 161 days.

(21) Appl. No.: 10/680,101

(22) Filed: Oct. 8, 2003

(65) Prior Publication Data

US 2004/0259295 A1 Dec. 23, 2004

(30) Foreign Application Priority Data

Jun. 23, 2003 (JP) .............................. 2003-178241

(51) Int. Cl.
*H01L 29/786* (2006.01)
(52) U.S. Cl. ...................... 257/368; 257/903; 257/350; 257/347; 257/623
(58) Field of Classification Search ................ 257/368, 257/903, 296, 350, 347, 67, 623; 438/147, 438/149, 275, 152, 978
See application file for complete search history.

(56) References Cited

U.S. PATENT DOCUMENTS

| | | | | |
|---|---|---|---|---|
| 5,403,762 A | * | 4/1995 | Takemura | 438/164 |
| 5,740,099 A | * | 4/1998 | Tanigawa | 365/51 |
| 6,424,016 B1 | * | 7/2002 | Houston | 257/407 |
| 6,451,708 B1 | * | 9/2002 | Ha | 438/738 |
| 6,469,317 B1 | * | 10/2002 | Yamazaki et al. | 257/59 |
| 6,498,369 B1 | * | 12/2002 | Yamazaki et al. | 257/347 |
| 6,525,403 B2 | * | 2/2003 | Inaba et al. | 257/618 |
| 6,537,891 B1 | * | 3/2003 | Dennison et al. | 438/406 |
| 6,872,605 B2 | * | 3/2005 | Takemura | 438/151 |
| 2003/0025163 A1 | * | 2/2003 | Kwon | 257/360 |
| 2003/0227060 A1 | * | 12/2003 | Yamauchi | 257/368 |

FOREIGN PATENT DOCUMENTS

| JP | 02263473 A | * | 10/1990 |
|---|---|---|---|
| JP | 9-135030 | | 5/1997 |
| JP | 10093093 A | * | 4/1998 |

OTHER PUBLICATIONS

E.J. Nowak, et al., "A Functional FinFET-DGCMOS SRAM Cell", International Electron Device Meeting, Technical Digest (USA), 2002, 4 pages.

* cited by examiner

Primary Examiner—Eugene Lee
(74) Attorney, Agent, or Firm—Oblon, Spivak, McClelland, Maier & Neustadt, P.C.

(57) ABSTRACT

A semiconductor device has a first and a second semiconductor layer provided on an insulating film on a support substrate. A first memory cell transistor, which constitutes a part of a memory cell in an SRAM, has a first gate electrode of a first conductivity type and first source/drain diffusion layers of a second conductivity type opposite to the first conductivity type. The following expression is fulfilled the thickness of the first conductivity type≦one-third of a length of the first gate electrode in its channel length. A first peripheral transistor, which constitutes a part of a peripheral circuit, has a third gate electrode and a third source/drain diffusion layers. The following expression is satisfied the thickness of the second semiconductor layer>one-third of a length of the third gate electrode in its channel length direction.

29 Claims, 8 Drawing Sheets

SEMICONDUCTOR DEVICE AND SEMICONDUCTOR DEVICE MANUFACTURING METHOD

CROSS-REFERENCE TO RELATED APPLICATIONS

This application is based upon and claims the benefit of priority from the prior Japanese Patent Application No. 2003-178241, filed Jun. 23, 2003, the entire contents of which are incorporated herein by reference.

BACKGROUND OF THE INVENTION

1. Field of the Invention

This invention relates to a semiconductor device and a semiconductor device manufacturing method, and more particularly to, for example, a SRAM (Static Access Memory) and a semiconductor device with an SOI (Silicon On Insulator) structure where transistors are formed in a semiconductor layer on an insulating film.

2. Description of the Related Art

The impurity concentration in the channel region of an MIS (Metal Insulator Semiconductor) transistor formed on a semiconductor substrate is controlled, thereby adjusting the threshold voltage of the transistor. In recent years, semiconductor devices have been miniaturized further, leading to a decrease in the amount of impurities implanted into the channel region. As s result, it is difficult to control the impurity concentration, which makes variations in the desired impurity concentration significant. This gives rise to a threshold-voltage variation problem. A decrease in the amount of impurities leads to an increase in soft errors caused mostly by cosmic rays, which is a serious problem.

It is known that a fully-depleted SOI structure is effective in overcoming the difficulty of controlling the threshold voltage and decreasing the occurrence of soft errors. The SOI structure is a structure where transistors are formed in a semiconductor layer (e.g., silicon) provided on an insulating film. SOI-structure transistors are broadly divided into the fully-depleted type and the partially-depleted type. In the fully-depleted type, when a transistor is on, the semiconductor layer (or body region) under the channel is depleted completely. In the partially-depleted type, when a transistor is on, only a part of the body region is depleted.

With the fully-depleted SOI structure (hereinafter, just referred to as the fully-depleted type), the threshold voltage of the transistor is determined mainly by the work function of the gate electrode. This reduces variations in the threshold voltage.

There has been a hybrid semiconductor device where a memory transistor and a peripheral transistor constituting a peripheral circuit are formed on a semiconductor substrate (including a semiconductor layer of an SOI structure). Variations in the threshold voltage and the occurrence of soft errors can be considered to decrease by making the hybrid semiconductor device the fully depleted type.

As described above, in the fully-depleted type, the threshold voltage of a transistor is determined by the work function of the gate electrode. The work function is determined mainly by the material of the gate electrode. Thus, when a plurality of transistors have gate electrode made of the same material, these transistors have the same threshold voltage.

When memory cells of a hybrid semiconductor device are SRAMs, it is not required so much to set a plurality of threshold voltages to the threshold voltages of a plurality of memory cell transistors on a semiconductor substrate. Thus, even when the same material is used for the gate electrode of each memory cell transistor, no problem arises.

On the other hand, since the functions of the transistors constituting the peripheral circuit are diverse in the peripheral circuit, a plurality of peripheral transistors are required to have different threshold voltages. However, as described above, when the same material is used for the gate electrode of each peripheral transistor, a plurality of threshold values cannot be set. To solve this problem, the following approach can be considered: a plurality of materials with different work functions are prepared and the desired threshold voltage is set by selecting these materials suitably. This method, however, increases the manufacturing cost very much. Therefore, use of a plurality of gate electrode materials is not a practical solution to the problem.

BRIEF SUMMARY OF THE INVENTION

According to a first aspect of the present invention, there is provided a semiconductor device: an insulating film provided on a support substrate; a first semiconductor layer provided on the insulating film; a first memory cell constituting a part of a memory cell in an SRAM, having a first gate electrode of a first conductivity type on a gate insulating film on the first semiconductor layer and first source/drain diffusion layers of a second conductivity type opposite to the first conductivity type which sandwich a region under the first gate electrode in the first semiconductor layer, and fulfilling an expression such as the thickness of the first semiconductor layer$\leq$one-third of a length of the first gate electrode in its channel length direction; a second semiconductor layer provided on the insulating film; and a first peripheral transistor constituting a part of a peripheral circuit, having a third gate electrode on a gate insulating film on the second semiconductor layer and third source/drain diffusion layers which sandwich a region under the third gate electrode in the second semiconductor layer, and fulfilling an expression such as the thickness of the second semiconductor layer$>$one-third of a length of the third gate electrode in its channel length direction.

According to a second aspect of the present invention, there is provided a semiconductor device: a semiconductor substrate; an insulating film provided on the semiconductor substrate; a semiconductor layer provided on the semiconductor substrate; a first memory cell constituting a part of a memory cell in an SRAM, having a first gate electrode of a first conductivity type on a gate insulating film on the first semiconductor layer and first source/drain diffusion layers of a second conductivity type opposite to the first conductivity type which sandwich a region under the first gate electrode in the semiconductor layer, and fulfilling an expression such as the thickness of the semiconductor layer$\leq$one-third of a length of the first gate electrode in its channel length direction; a first peripheral transistor constituting a part of a peripheral circuit, having a third gate electrode on a gate insulating film on the semiconductor substrate and third source/drain diffusion layers which sandwich a region under the third gate electrode in the semiconductor substrate.

According to a third aspect of the present invention, there is provided a semiconductor device: an insulating film provided on a support substrate; a first semiconductor layer provided on the insulating film; a first memory cell constituting a part of a memory cell in an SRAM, having a first gate electrode consisting essentially of a metal material on a gate insulating film on the first semiconductor layer and first source/drain diffusion layers which sandwich a region under the first gate electrode in the first semiconductor layer, and fulfilling an expression such as the thickness of the first semiconductor layer≦one-third of a length of the first gate electrode in its channel length direction; a second semiconductor layer provided on the insulating film; and a first peripheral transistor constituting a part of a peripheral circuit, having a third gate electrode on a gate insulating film on the second semiconductor layer and third source/drain diffusion layers which sandwich a region under the third gate electrode in the second semiconductor layer, and fulfilling an expression such as the thickness of the second semiconductor layer>one-third of a length of the third gate electrode in its channel length direction.

According to a fourth aspect of the present invention, there is provided a semiconductor device: a semiconductor substrate; an insulating film provided on the semiconductor substrate; a semiconductor layer provided on the semiconductor substrate; a first memory cell constituting a part of a memory cell in an SRAM, having a first gate electrode consisting essentially of a metal material on a gate insulating film on the first semiconductor layer and first source/drain diffusion layers which sandwich a region under the first gate electrode in the semiconductor layer, and fulfilling an expression such as the thickness of the semiconductor layer≦one-third of a length of the first gate electrode in its channel length direction; a first peripheral transistor constituting a part of a peripheral circuit, having a third gate electrode on a gate insulating film on the semiconductor substrate and third source/drain diffusion layers which sandwich a region under the third gate electrode in the semiconductor substrate.

According to a fifth aspect of the present invention, there is provided a semiconductor device: an insulating film provide on a support substrate; a first semiconductor layer provided on the insulating film; a first memory cell constituting a part of a memory cell in an SRAM, having a gate electrode on a gate insulating film on a first side of the first semiconductor layer, on a second side opposite to the first side, and on the top in contact with the first and second sides, having first source/drain diffusion layers which sandwich a region enclosed by the first gate electrode in the first semiconductor layer; a second semiconductor layer provided on the insulating film; and a first peripheral transistor constituting a part of a peripheral circuit, having a third gate electrode on a gate insulating film on the second semiconductor layer and third source/drain diffusion layers which sandwich a region under the third gate electrode in the second semiconductor layer, and fulfilling an expression such as the thickness of the second semiconductor layer>one-third of a length of the third gate electrode in its channel length direction.

According to a sixth aspect of the present invention, there is provided a semiconductor device manufacturing method: forming a first semiconductor layer with a first thickness on an insulating film on a support substrate in a first region where a memory cell transistor constituting a part of a memory cell in an SRAM is to be formed; forming a second semiconductor layer with a second thickness greater than the first thickness on the insulating film in a third region where a peripheral transistor constituting a part of a peripheral circuit is to be formed; implanting an impurity of a first conductivity type into the second semiconductor layer in the third region; forming a conductive film above the first and second semiconductor layers; implanting an impurity of a second conductivity type opposite to the first conductivity type into the conductive film in the third region; implanting an impurity of the first conductivity type into the conductive film in the first region; forming from the conductive film a first gate electrode which fulfills an expression such as the first thickness≦one-third of a length of the first gate electrode in its channel length direction in the first region and a third gate electrode which fulfills an expression such as the second thickness>one-third of a length of the third gate electrode in its channel length direction from the conductive film in the third region; and forming a first and third source/drain diffusion layers of the second conductivity type in the first and second semiconductor layers in the vicinity of the first and third gate electrodes, respectively.

According to a seventh aspect of the present invention, there is provided a semiconductor device manufacturing method: forming a first semiconductor layer with a first thickness on an insulating film on a support substrate in a first region where a memory cell transistor constituting a part of a memory cell in an SRAM is to be formed; forming a second semiconductor layer with a second thickness greater than the first thickness on the insulating film in a third region where a peripheral transistor constituting a part of a peripheral circuit is to be formed; forming, on the second semiconductor layer in the third region, the peripheral transistor which has a third gate electrode provided on a gate insulating film on the second semiconductor layer and third source/drain diffusion layers that sandwich a region under the third gate electrode in the second semiconductor layer and which fulfills an expression such as the thickness of the second semiconductor layer>one-third of a length of the third gate electrode in its channel length direction; forming a metal film consisting essentially of tungsten, titanium, molybdenum, nickel, cobalt, platinum, or an alloy of these metals above the first semiconductor layer in the first region; forming from the metal film a first gate electrode which fulfills an expression such as the first thickness≦one-third of a length of the first gate electrode in its channel length direction in the first region; and forming first source/drain diffusion layers in the first semiconductor layer in the vicinity of the first gate electrode.

DETAILED DESCRIPTION OF THE INVENTION

Hereinafter, referring to the accompanying drawings, embodiments of the present invention will be explained. In the explanation below, component elements having almost the same functions and configurations are indicated by the same reference numerals. A repetitive explanation will be given only when necessary.

(First Embodiment)

Figure 1:
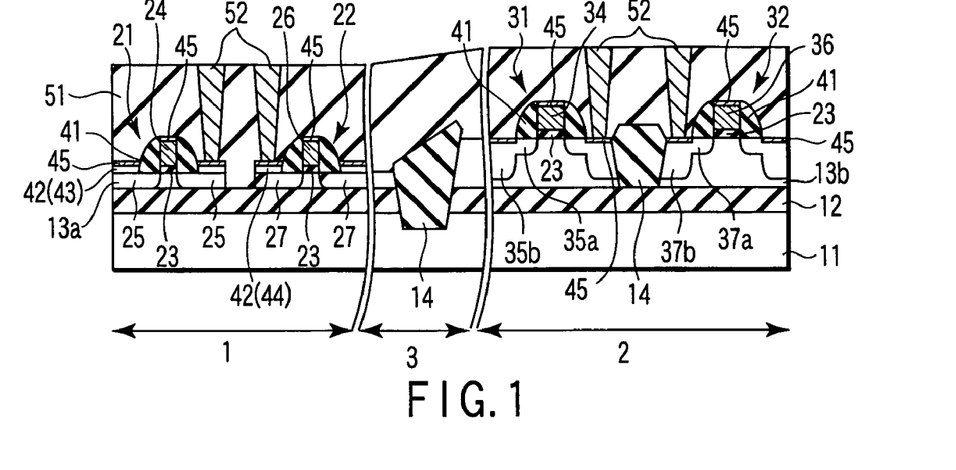
FIG. 1 is a schematic sectional view of a semiconductor device according to a first embodiment of the present invention.

FIG. 1 is a schematic sectional view of a semiconductor device according to a first embodiment of the present invention. As shown in FIG. 1, the semiconductor device has a memory cell region 1, a peripheral circuit region 2, and a boundary region 3. On a semiconductor substrate (support substrate) 11, an insulating film (buried oxide) 12 made of, for example, a silicon oxide film is provided. As a material for the semiconductor substrate 11, for example, $Al_2O_3$ (aluminum oxide), Ge (germanium), AlN (aluminum nitride), Si (silicon), or sapphire may be used.

On the insulating film 12 in the memory cell region 1, a semiconductor layer 13a (a first semiconductor layer) is provided. On the insulating film 12 in the peripheral circuit region 2, a semiconductor layer 13b (a second semiconductor layer) is provided. The semiconductor layers 13a, 13b are essentially made of, for example, silicon, germanium or a composition of silicon and germanium. The semiconductor layers 13a, 13b differ in thickness. The thickness of each of the semiconductor layers 13a, 13b is set in consideration of the condition explained later so that the transistors in the memory cell region 1 are of the fully-depleted type and the transistors in the peripheral circuit region 2 are of the partially-depleted type. In the boundary region 3, an element isolation insulating film made of, for example, a silicon oxide film, is formed.

In a first and a second region of the semiconductor layer 13a, an n-type and a p-type memory cell transistor 21, 22 are formed respectively. The memory cell transistors 21, 22 constitute a part of a memory cell in an SRAM.

The memory cell transistor 21 (a first memory cell transistor) has a gate insulating film 23, a first gate electrode 24 on the gate insulating film 23, and a pair of first source/drain diffusion layers 25. The first gate electrode 24, which is composed of a material made of, for example, $Si_XGe_{1-X}$ ($0 \leq X \leq 1$), is of the p-conductivity type. The first source/drain diffusion layers 25 sandwich the region (or the channel region) under the first gate electrode 24 in the semiconductor layer 13a. The lower ends of the first source/drains 25 reach the lower end of the semiconductor layer 13a.

The memory cell transistor 22 (a second memory cell transistor) has a gate insulating film 23, a second gate electrode 26 on the gate insulating film 23, and a pair of second source/drain diffusion layers 27. The second gate electrode 26, which is made of the same material as that of the first gate electrode 24, is of the n-conductivity type. The second source/drain diffusion layers 27 sandwich the region under the second gate electrode 26 in the semiconductor layer 13a. The lower ends of the first source/drain diffusion layers 27 reach the lower end of the semiconductor layer 13a.

In the memory cell region, the first gate electrode 24 of the n-type memory cell transistor 21 is of the p-conductivity type, whereas the second gate electrode 26 of the p-type memory cell transistor 22 is of the n-conductivity type. This is attributed to the fact that the memory cell transistors 21, 22 are of the fully-depleted type. As described above, in the case of the fully-depleted type, the threshold voltage of a transistor is determined by a work function. However, if the conductivity type of the gate electrode of an n-type transistor is the n-type, the transistor does not function as an n-type transistor having the same characteristic as that of a conventional equivalent. For this reason, the gate electrode of an n-type transistor is made the p-type, thereby adjusting the work function and the threshold voltage. The reason why the gate electrode of a p-type transistor is made the n-type is the same.

In a third and a fourth region of the semiconductor layer 13b, an n-type and a p-type peripheral transistor 31, 32 are formed respectively. The peripheral transistors 31, 32 constitute a part of the peripheral circuit. The peripheral circuit includes various types of circuits necessary for the operation of the SRAM. Between the peripheral transistors 31, 32, an element isolation insulating film 14 is provided.

The peripheral transistor 31 (a first peripheral transistor) has a gate insulating film 23, a third gate electrode 34 on the gate insulating film 23, and a pair of third source/drain diffusion layers 35. The third gate electrode 34, which is made of the same material as that of, for example, the first gate electrode 24, is of the n-conductivity type. The third source/drain diffusion layers 35, which sandwich the region under the third gate electrode 34 in the semiconductor layer 13b, are composed of a low concentration region 35a and a high concentration region 35b.

The peripheral transistor 32 (a second peripheral transistor) has a gate insulating film 23, a fourth gate electrode 36 on the gate insulating film 23, and a pair of fourth source/drain diffusion layers 37. The fourth gate electrode 36, which is made of the same material as that of, for example, the first gate electrode 24, is of the p-conductivity type. The fourth source/drain diffusion layers 37, which sandwich the region under the fourth gate electrode 36 in the semiconductor layer 13b, are composed of a low concentration region 37a and a high concentration region 37b.

On the sidewalls of the first to fourth gate electrodes 24, 26, 34, 36, a sidewall insulating film 41 made of, for example, a silicon nitride film or a silicon oxide film, is provided. On the surfaces of the first and second source/drain diffusion layers 25, 27, a semiconductor film 42 is provided. The semiconductor film 42 is composed of a material made of, for example, $Si_XGe_{1-X}$ ($0 \leq X \leq 1$). A high concentration impurity for a contact region is implanted in the semiconductor film 42, thereby forming high concentration regions 43, 44. Silicide 45 is provided on the surfaces of the first to fourth gate electrodes 24, 26, 34, 36, the surface of the semiconductor film 42, and the surfaces of the third and fourth source/drain diffusion layers 35, 37.

An interlayer insulating film 51 is provided on the entire surface of the semiconductor layers 13a, 13b. The semiconductor layer 13b is removed between the memory cell transistors 21, 22. A part of the interlayer insulating film 51 reaches the insulating film in the place where the semiconductor layer 13b has been removed. A contact plug 52 is provided in the interlayer insulating film 51. The contact plug 52 reaches, for example, the silicide 45 on the first and second source/drain diffusion layers 25, 27 and the silicide 45 on the third and fourth source/drain diffusion layers 35, 37.

Next, the fully-depleted type and the partially-depleted type will be explained. Generally, whether a transistor becomes the full-depleted type or the partially-depleted type is determined by the following expression:

$$T_{si} \leq L/3 \tag{1}$$

Where $T_{si}$ is the thickness of the semiconductor layer and L is the length of the gate electrode.

The length of the gate electrode is the length in the same direction as that of the channel length. Fulfilling expression (1) makes the transistor the fully-depleted type. In the first embodiment, the memory cell transistors 21, 22 are of the fully-depleted type and the peripheral transistors 31, 32 are of the partially-depleted type.

As a concrete example, the following setting can be done. The length L of each of the first and second gate electrodes 24, 26 is set to, for example, 6 to 60 nm. In this case, the semiconductor layer 13a has a thickness of 2 to 20 nm or less. For example, when the length L of each of the first and second gate electrodes is 20 nm, the thickness of the semiconductor layer 13a is set to 20/3 nm or less.

The length L of each of the third and fourth electrodes 34, 36 is set to, for example, 6 to 60 nm. In this case, the semiconductor layer 13b has a thickness larger than 2 to 20 nm.

Figure 2:
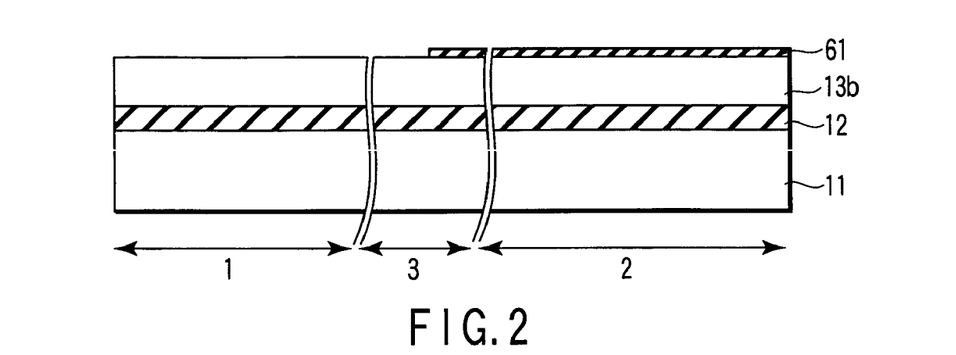
FIGS. 2, 3, 4, 5, 6, 7, 8, 9, 10, 11, 12, 13, 14, 15, 16, and 17 are sectional views showing sequentially the steps of manufacturing the semiconductor device of FIG. 1.

Next, a method of manufacturing a semiconductor device with the above configuration will be explained by reference to FIGS. 2 to 17. FIGS. 2 to 17 are sectional views to help explain sequentially the steps of manufacturing the semiconductor device of FIG. 1. First, as shown in FIG. 2, the insulating film 12 and semiconductor layer 13b are provided on the semiconductor substrate 11. Specifically, the semiconductor layer 13b has such a thickness as makes the peripheral transistors 31, 32 a partially-depleted type, taking into account the above expression (1) and the gate length of the third and fourth gate electrodes 34, 36. Then, a silicon nitride film 61 is formed on the semiconductor layer 13b in the peripheral circuit region 2.

Figure 3:
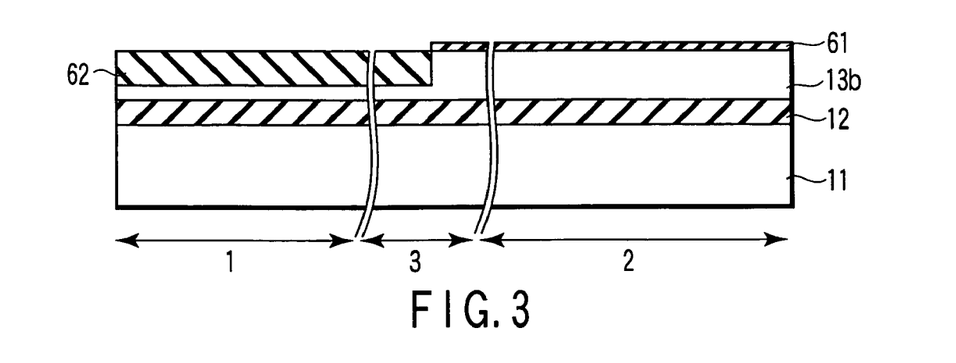

Next, as shown in FIG. 3, the upper part of the semiconductor layer 13b in the memory cell region 1 is thermally oxidized, thereby forming an oxide film 62. The thickness of the oxide film 62 is determined by the thickness of the semiconductor layer 13b remaining in the memory cell region 1 and the gate length of the memory cell transistors 21, 22 in such a manner that the memory cell transistors 21, 22 become the fully-depleted type.

Figure 4:
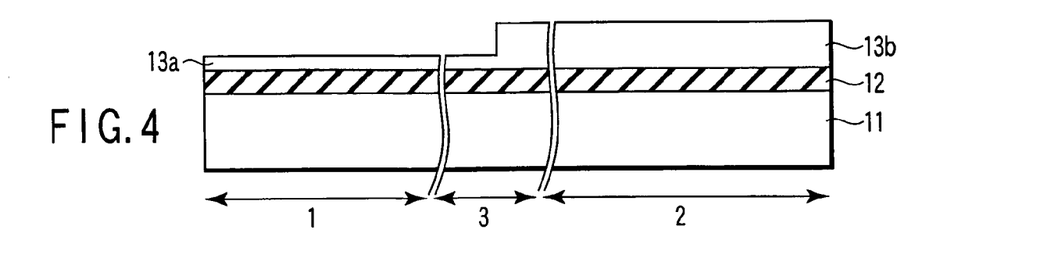

Next, as shown in FIG. 4, the oxide film 62 and silicon nitride film 61 are removed. As a result, the semiconductor layer 13a is formed in the memory cell region 1.

Figure 5:
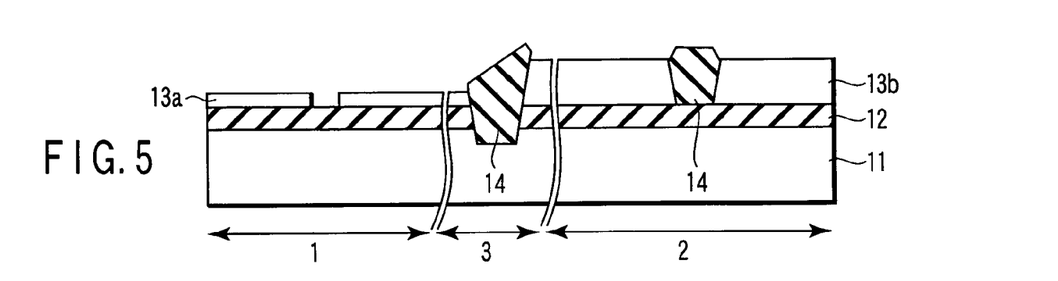

Next, as shown in FIG. 5, the portions of the semiconductor layers 13a, 13b around the memory transistors 21, 22, peripheral transistors 31, 33, and the boundary region 3 are removed. Then, in the parts where the semiconductor layers 13a, 13b have been removed, for example, a silicon oxide film is buried. As a result, the element isolation insulating film 14 is formed.

Figure 6:
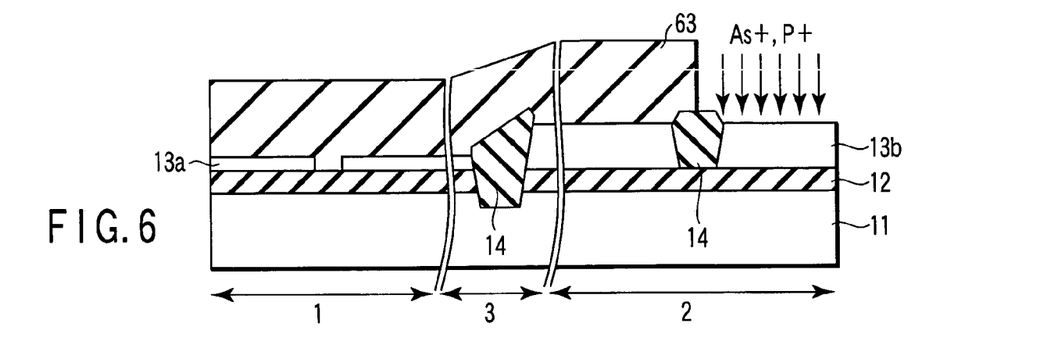

Next, as shown in FIG. 6, using photolithographic processes and etching techniques such as and RIE (Reactive Ion Etching), hereinafter, collectively referred to as the known method, the whole of the memory cell region 1 and the region where the n-type memory cell transistor 21 is to be formed are covered with a photoresist 63. With the photoresist 63 as a mask, an impurity for forming an n-type semiconductor (for example, arsenic (As) or phosphorus (P)) is implanted into the semiconductor layers 13a, 13b. The amount of impurity implanted is determined by the threshold value of the p-type peripheral transistor 32. Then, the photoresist 63 is removed.

Figure 7:
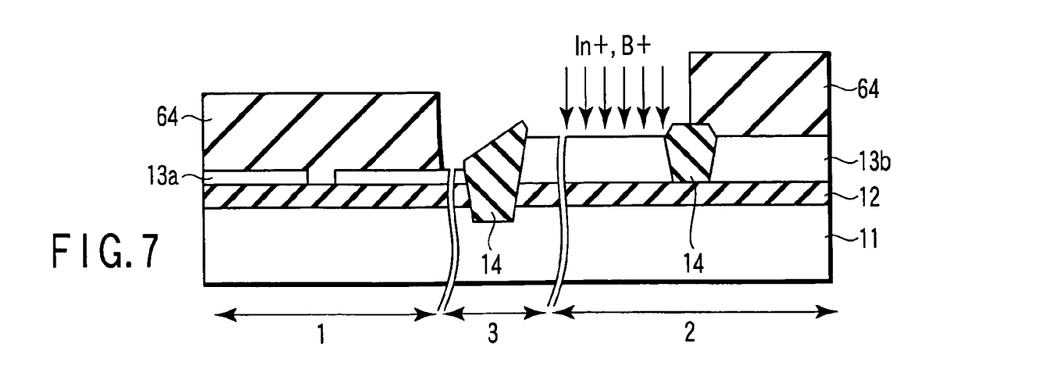

Next, as shown in FIG. 7, by the known method, the whole of the memory cell region 1 and the region where the p-type memory cell transistor 22 is to be formed are covered with a photoresist 64. With the photoresist 64 as a mask, an impurity for forming a p-type semiconductor (for example, boron (B) or indium (In)) is implanted into the semiconductor layers 13a, 13b. The amount of impurity implanted is determined by the threshold value of the n-type peripheral transistor 31. Then, the photoresist 64 is removed.

Figure 8:
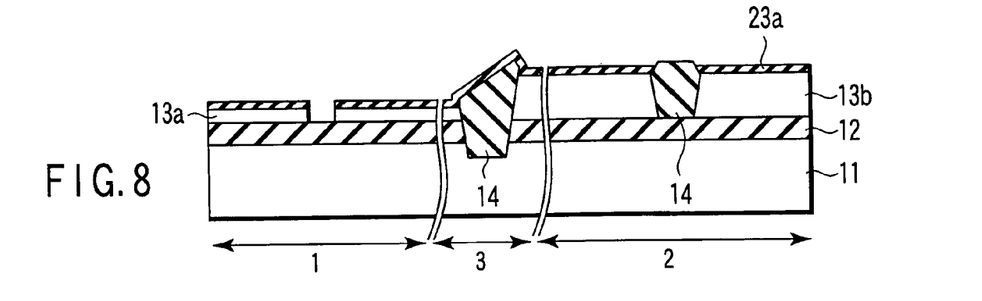

Next, as shown in FIG. 8, the semiconductor layers 13a, 13b are thermally oxidized, thereby forming the gate insulating film 23. The thickness of the gate insulating film 23 in the memory cell region 1 may differ from that in the peripheral circuit region 2.

Figure 9:
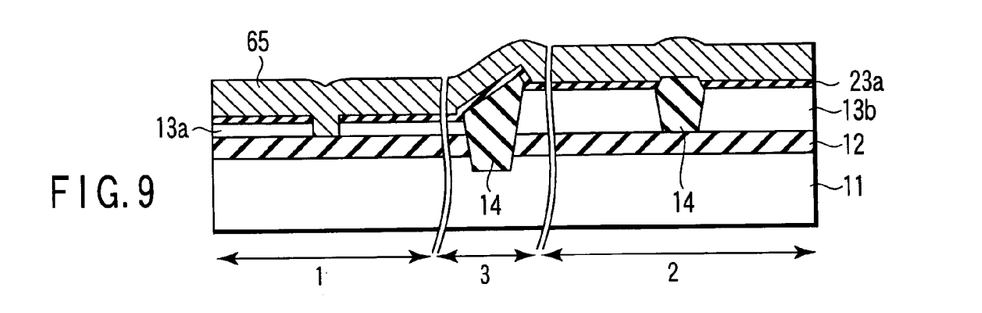

Then, as shown in FIG. 9, a gate electrode material film 65 is deposited on the entire surface of the semiconductor layers 13a, 13b.

Figure 10:
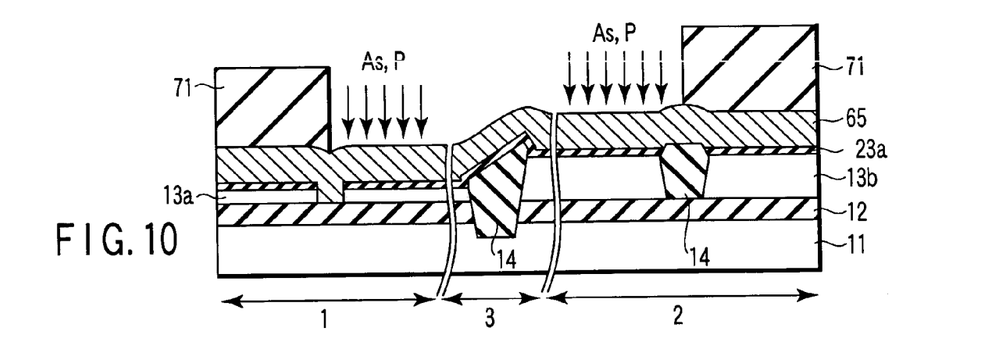

Next, as shown in FIG. 10, by the known method, the region where the n-type memory cell transistor 21 and p-type peripheral transistor 32 are to be formed is covered with a photoresist 71. With the photoresist 71 as a mask, an impurity (e.g., arsenic or phosphorus) for tuning a conductive type of the material film into the n-type is implanted into the material film 65. The threshold value of the memory cell transistor 21 is determined by the amount of the impurity implanted. Therefore, the condition for impurity implantation is so determined that the memory cell transistor 21 has a desired threshold value. Then, the photoresist 71 is removed.

Figure 11:
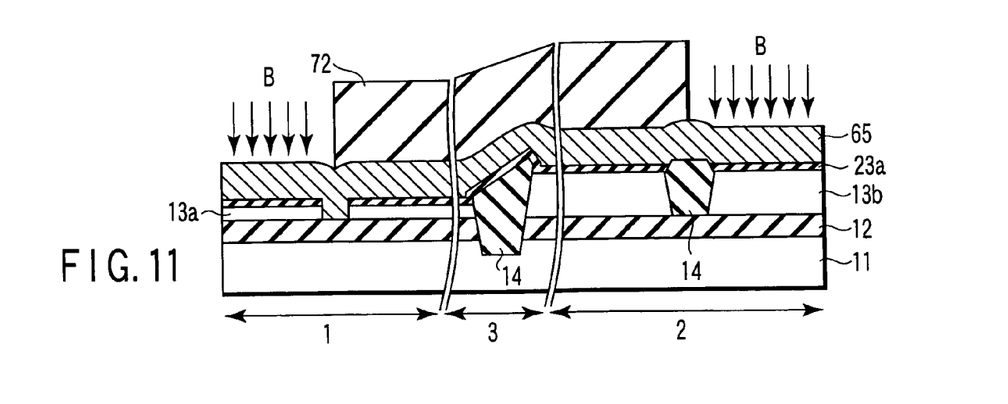

Next, as shown in FIG. 11, the region where the p-type memory cell transistor 22 and n-type peripheral transistor 31 are to be formed is covered with a photoresist 72. With the photoresist 72 as a mask, an impurity (e.g., boron) for turning a conductive type of the material film into the p-type is implanted into the material film 65. The threshold value of the memory cell transistor 21 is determined by the amount of the impurity implanted. Therefore, the condition for impurity implantation is so determined that the memory cell transistor 21 has a desired threshold value. Then, the photoresist 72 is removed.

Figure 12:
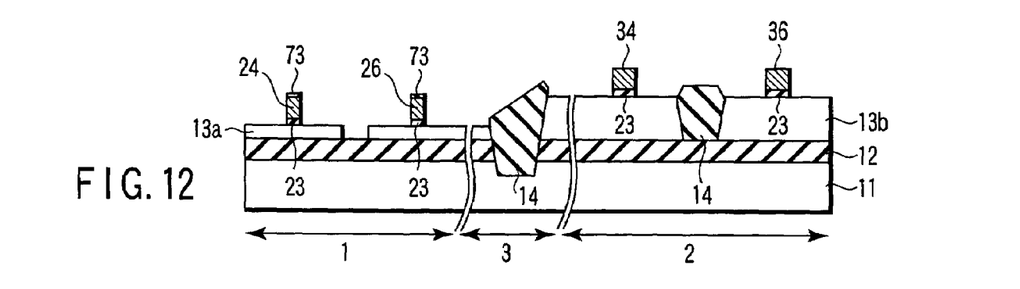

Next, as shown in FIG. 12, by the known method, an insulating film 73 is formed on the entire surface of the material film 65. The insulating film 73 has the patterns of the first to fourth gate electrodes 24, 26, 34, 36. Next, with the insulating film 73 as a mask, the material film 65 is etched by etching techniques, such as RIE. As a result, the first to fourth gate electrodes 24, 26, 34, 36 are formed. Then, the insulating film 73 in the peripheral circuit region 2 is removed.

Figure 13:
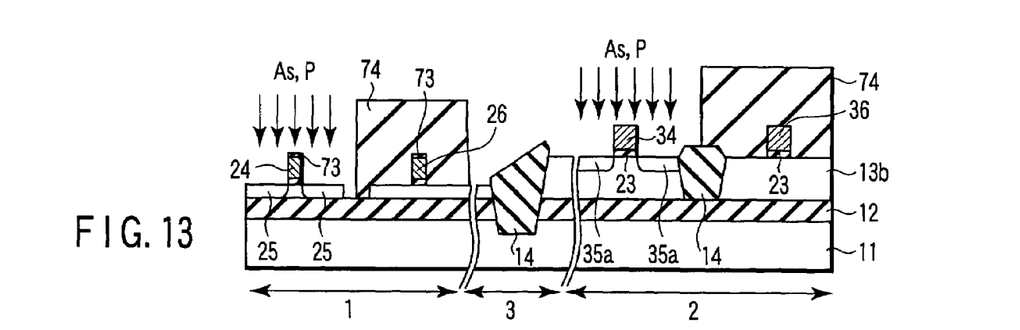

Next, as shown in FIG. 13, by the known method, the region where the p-type memory cell transistor 22 and p-type peripheral transistor 32 are to be formed is covered with a photoresist 74. Then, with the photoresist 74, insulating film 73, and third gate electrode 34 as a mask, ion implantation of an impurity, such as arsenic or phosphorus, is carried out at a low acceleration. As a result, the first source/drain diffusion layer 25 and the low concentration region 35a of the third source/drain diffusion layer 35 are formed. In this process, the insulating film 73 has the function of preventing impurities from being implanted into the first gate electrode 24. Then, the photoresist 74 is removed.

Figure 14:
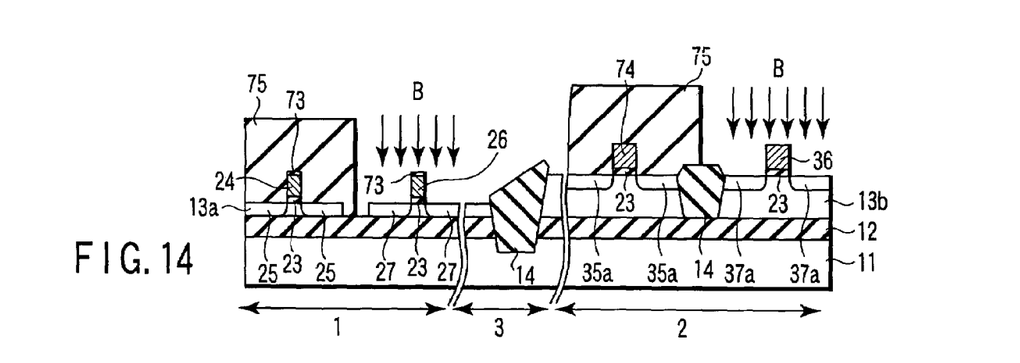

Next, as shown in FIG. 14, by the known method, the region where the n-type memory cell transistor 21 and n-type peripheral transistor 31 are to be formed is covered with a photoresist 75. Then, with the photoresist 75, insulating film 73, and fourth gate electrode 36 as a mask, ion implantation of an impurity, such as boron or boron fluoride ($BF_2$), is carried out at a low acceleration. As a result, the second source/drain diffusion layer 27 and the low concentration region 37a of the fourth source/drain diffusion layer 37 are formed. In this process, the insulating film 73 has the function of preventing impurities from being implanted into the second gate electrode 24. Then, the photoresist 75 is removed.

Figure 15:
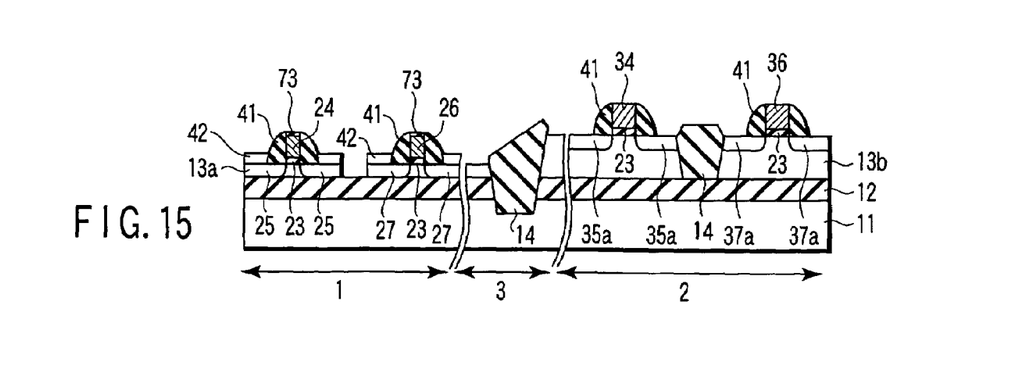

Next, as shown in FIG. 15, the material film for the sidewall insulating film 41 is deposited and etched, thereby forming the sidewall insulating film 41. Then, a semiconductor film 42 is formed on the first and second source/drain diffusion layers 25, 27 by selective growth.

Figure 16:
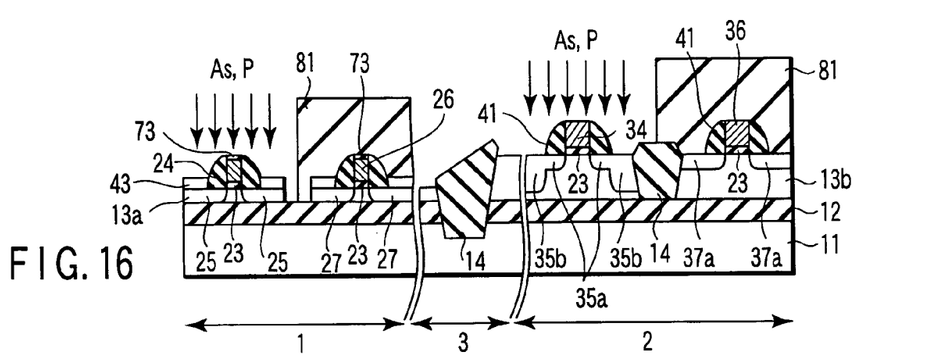

Next, as shown in FIG. 16, by the known method, the region where the p-type memory cell transistor 22 and p-type peripheral transistor 32 are to be formed is covered with a photoresist 81. Then, with the photoresist 81, insulating film 73, third gate electrode 34, and sidewall insulating film 41 as a mask, ion implantation of an impurity, such as arsenic or phosphorus, is carried out at a high acceleration. As a result, the high concentration regions 35b, 43 are formed. In this process, the insulating film 73 has the function of preventing impurities from being implanted into the first gate electrode 24. Then, the photoresist 81 is removed.

Figure 17:
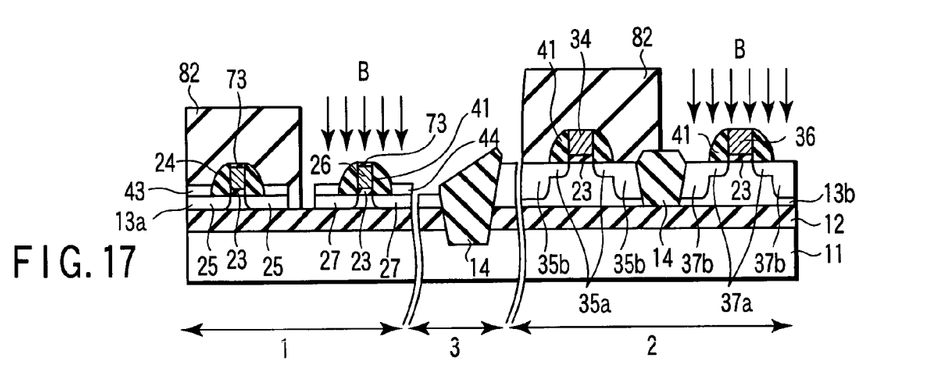

Next, as shown in FIG. 17, by the known method, the region where the n-type memory cell transistor 21 and n-type peripheral transistor 31 are to be formed is covered with a photoresist 82. Then, with the photoresist 82, insulating film 73, third gate electrode 34, and sidewall insulating film 41 as a mask, ion implantation of an impurity, such as boron, is carried out at a high acceleration. As a result, the high concentration regions 37b, 44 are formed. In this process, the insulating film 73 has the function of preventing impurities from being implanted into the second gate electrode 24. Then, the photoresist 82 and insulating film 73 are removed.

Next, as shown in FIG. 1, such metal as nickel (Ni), cobalt (Co), platinum (Pt), palladium (Pd), or titanium (Ti) is deposited on the entire surface of the semiconductor substrate 11 by sputtering. Then, the metal is diffused and reacted by thermal treatment, thereby forming silicide 45. Next, a material film for the interlayer insulating film 51 is deposited on the entire surface of the semiconductor substrate 11 by CVD (Chemical Vapor Deposition) techniques. Then, by the known method, a contact hole is made in the region where the contact plug 52 is to be formed. Next, the contact hole is filled with conductive material, thereby forming the contact plug 52. Thereafter, a wiring layer and another interlayer insulating film (not shown) are formed, if necessary.

In the semiconductor device according to the first embodiment, the memory cell transistors 21, 22 constituting a part of the SRAM are of the fully-depleted type and the peripheral transistors 31, 32 are of the partially-depleted type. Thus, in the memory cell transistors 21, 22, it is possible to prevent variations in the threshold voltage and reduce the occurrence of soft errors. On the other hand, in the peripheral circuit region 2, the threshold voltage can be set with a high degree of freedom by controlling the amount of impurity in the channel regions of the peripheral transistors 31, 32 as in a conventional equivalent. As described above, it is possible to realize a semiconductor device where each of the memory cell transistors 21, 22 and peripheral transistors 31, 32 has the desired characteristic.

Furthermore, in the semiconductor device of the first embodiment, all of the first to fourth gate electrodes 24, 26, 34, 36 are made of the same material. Consequently, since the memory cell region 1 and peripheral circuit region 2 can be formed in the same step, the number of steps can be small as compared with a case where they are formed in separate steps.

As described above, in a fully-depleted type transistor, the threshold voltage cannot be controlled by the amount of impurity in the channel region. For this reason, when the conductivity type of a fully-depleted type transistor is made equal to the conductivity type of the gate electrode as in a conventional equivalent, the transistor does not operate properly. In other words, a threshold voltage similar to that of a conventional transistor cannot be obtained. In contrast, with a semiconductor device according to the first embodiment, the conductivity type of the memory cell transistors 21, 22 is made opposite to the conductivity of the first and second gate electrodes 24, 26. As a result, it is possible to give the same characteristics of conventional n-type and p-type transistors to the n-type and p-type memory cell transistors 21, 22. That is, the same applications as the existing ones can be used. Furthermore, in such a configuration, since the position of the mask for implanting impurities into the first to fourth gate electrodes 24, 26, 34, 36 has only to be changed, the number of steps is prevented from increasing.

(Second Embodiment)

Figure 18:
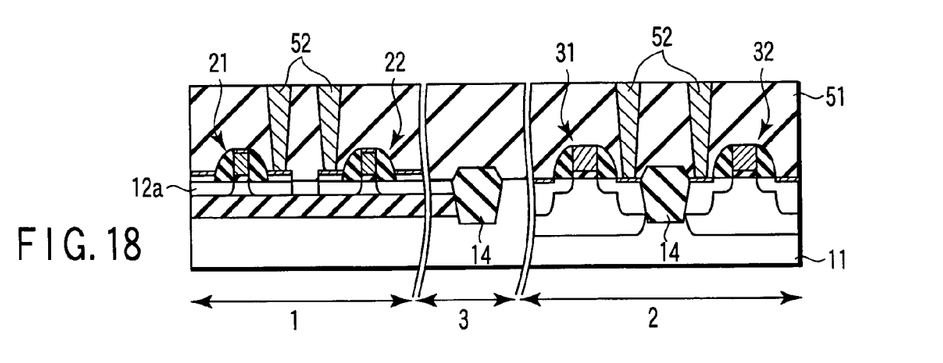
FIG. 18 is a schematic sectional view of a semiconductor device according to a second embodiment of the present invention.

In the first embodiment, the peripheral transistors 31, 32 are formed in the semiconductor layer 13b. In contrast, in a second embodiment of the present invention, they are formed in the semiconductor substrate 11, which is what is called the bulk type.

FIG. 18 is a schematic sectional view of a semiconductor device according to the second embodiment. As shown in FIG. 18, the peripheral transistors 31, 32 are formed on the semiconductor substrate 11. The other parts are the same as the first embodiment. Use of the bulk type makes it possible to control the threshold voltage of the transistor easily by the implantation of impurities into the channel region as in the partially-depleted type.

The semiconductor device of the second embodiment produces the same effect as the first embodiment.

(Third Embodiment)

Figure 19:
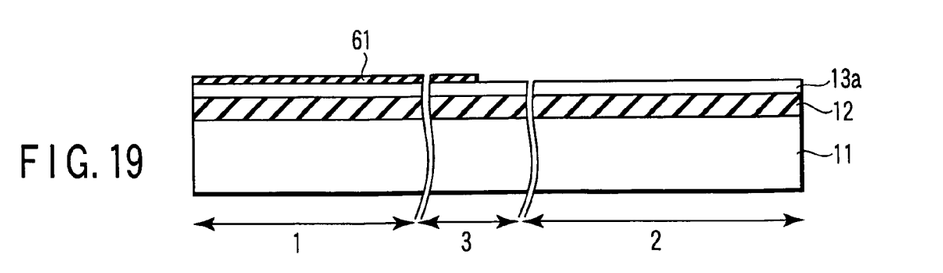
FIGS. 19, 20, and 21 are sectional views showing sequentially the steps of manufacturing a semiconductor device according to a third embodiment of the present invention.
Figure 20:
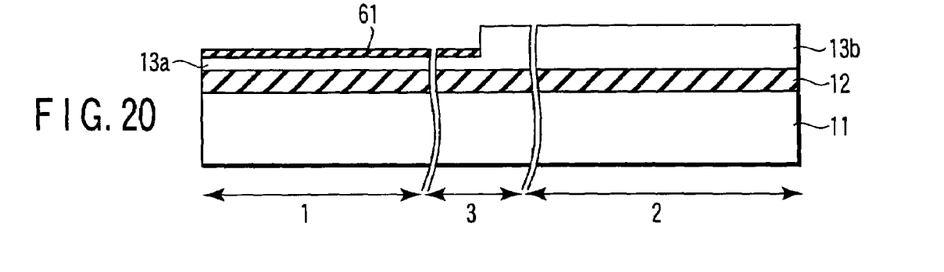
Figure 21:
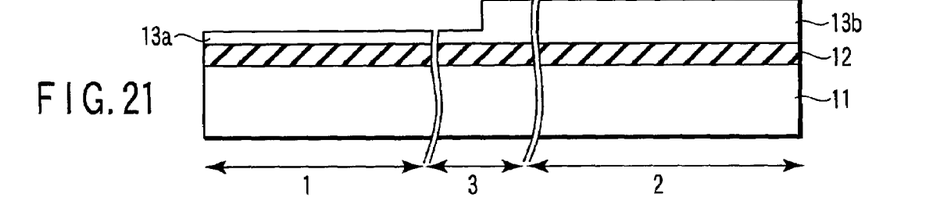

A third embodiment of the present invention relates to a modification of the first embodiment. The third embodiment differs from the first embodiment in the manufacturing processes. Therefore, the sectional view is the same as the first embodiment (FIG. 1). Hereinafter, the manufacturing steps will be explained by reference to FIG. 19 to 21. FIGS. 19 to 21 are sectional views to help explain part of the steps of manufacturing a semiconductor device according to the third embodiment.

As shown in FIG. 19, the semiconductor layer 13a is provided on the insulating film 12 on the semiconductor substrate 11. Specifically, the semiconductor layer 13a has such a thickness as makes the memory transistors 21, 22 the fully-depleted type, taking into account the above expression (1) and the gate length of the third and fourth gate electrodes 24, 26. Then, a silicon nitride film 61 is formed on the semiconductor layer 13a.

Next, as shown in FIG. 20, on the semiconductor layer 13a in the peripheral circuit region 2, a layer made of the same material as the semiconductor layer 13a is formed by, for example, epitaxial growth. As a result, the semiconductor layer 13b is formed in the peripheral circuit region 2.

Next, as shown in FIG. 21, the silicon nitride film 61 is removed. The subsequent steps are the same as those of FIG. 5 and later in the first embodiment.

The semiconductor device of the third embodiment produces the same effect as the first embodiment.

(Fourth Embodiment)

In the first to third embodiments, a semiconductor is used as a material for the first and second gate electrodes 24, 26. In contrast, in a fourth embodiment of the present invention, metal is used instead.

A sectional view of the fourth embodiment is the same as the first embodiment (FIG. 1). As a material for the first and second gate electrodes 24, 26, for example, tungsten (W), titanium, molybdenum (Mo), nickel, cobalt, platinum, or an alloy of these metals may be used. Furthermore, in these materials, silicon, germanium, nitrogen (N), boron, arsenic, or phosphorus may be contained. The material for the first and second gate electrodes 24, 26 is selected suitably according to the work function of the metal material so that the memory cell transistors 21, 22 may have the desired threshold values. In the fourth embodiment, there is no need to make the conductivity type of the memory cell transistors 21, 22 opposite to the conductivity type of the gate electrode.

A semiconductor device of the fourth embodiment is manufactured by, for example, the processes explained below. For example, after the process of FIG. 5, the whole of the peripheral circuit region 2 is covered with a photoresist. Next, using CVD, lithography, etching, and ion implantation, the memory cell transistors 21, 22 are formed. Then, the photoresist in the peripheral circuit region 2 is removed. At the same time, the whole of the memory cell region 1 is covered with a photoresist. Next, using CVD, lithography, etching, and ion implantation, the peripheral transistors 31, 32 are formed. Then, the photoresist in the peripheral circuit region 2 is removed. The subsequent processes are the same as those of FIG. 15 and later.

In the semiconductor device of the fourth embodiment, the memory cell transistors 21, 22 are of a fully-depleted type and the peripheral transistors 31, 32 are of the partially-depleted type as in the first embodiment. Therefore, the semiconductor device of the fourth embodiment produces the same effect as that of the first embodiment.

Furthermore, in the semiconductor device of the fourth embodiment, the first and second gate electrodes 24, 26 (the gate electrodes of the memory cell transistors 21, 22) are made of metal. Thus, the threshold voltages of the memory cell transistors 21, 22 can be set with a high degree of freedom by using a metal whose work function corresponds to the desired threshold values of the memory cell transistors 21, 22.

In addition, making the first and second gate electrodes 24, 26 of metal materials prevents a depletion layer from occurring in the vicinity of the gate insulating films 23 of the first and second gate electrodes 24, 26.

In the fourth embodiment, the number of manufacturing steps is larger than that in the first embodiment. However, since the fourth embodiment produces the effect unobtainable in the first embodiment, it is important to select one of the first and fourth embodiments suitably according to the characteristics of the semiconductor required.

(Fifth Embodiment)

A fifth embodiment of the present invention is used to be added to the first or second embodiment. In the fifth embodiment, almost the whole first and second gate electrodes 24, 27 are turned into silicide.

Figure 22:
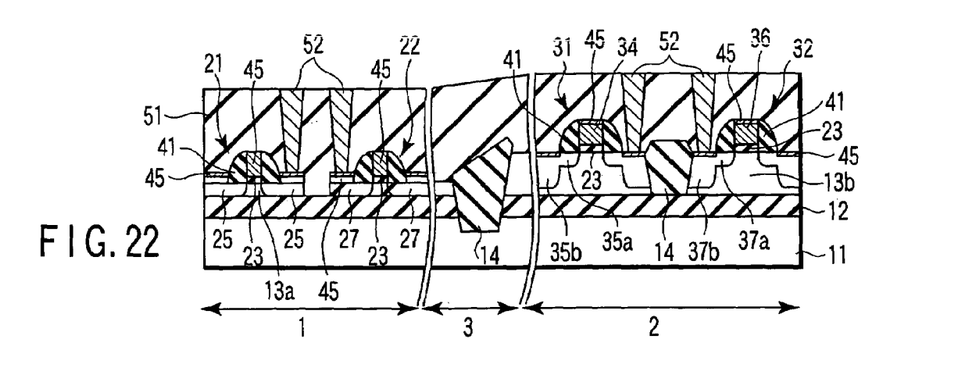
FIGS. 22, 23, and 24 are sectional views showing sequentially the steps of manufacturing a semiconductor device according to a fifth embodiment of the present invention.

As shown in FIG. 22, almost the whole first and second gate electrodes 24, 26 are turned into silicide. Here, almost the whole first and second gate electrodes 24, 26 means 90% or more of the volume of the first and second gate electrodes 24, 26, preferably 95 to 100%. With this configuration, the effect explained later is obtained.

Turning only the whole first and second gate electrodes into silicide is effected in, for example, the manner explained below. After the process of turning the electrodes into silicide, the subsequent processes are the same as those in the first embodiment.

Now a first method will be explained. First, the same steps as those up to the step of FIG. 12 in the first embodiment are carried out. At this time, the material film 65 is so patterned that the volume of the first and second gate electrodes 24, 26 becomes 80%, preferably 60% or less, of the volume of the third and fourth gate electrodes 34, 36. An example of the volume setting method is to make the gate widths of the first to fourth gate electrodes 24, 26, 34, 36 the same and set the gate lengths of the third and fourth gate electrodes to 80%, preferably 60% or less, of the gate lengths of the first and second gate electrodes 24, 26.

Next, the same steps as those in FIGS. 13 to 17 are carried out. Then, in the step of turning into silicide after the step of FIG. 17, the volume (or the gate length) of the first to fourth gate electrodes 24, 26, 34, 36 is caused to meet the above-described relationship, thereby turning only the whole first and second gate electrodes 24, 26 into silicide. Since the volume of the third and fourth gate electrodes 34, 36 is large, the whole third and fourth gate electrodes are not turned into silicide, with the result that silicide 45 is formed only in the vicinity of the top as in the first embodiment.

Figure 23:
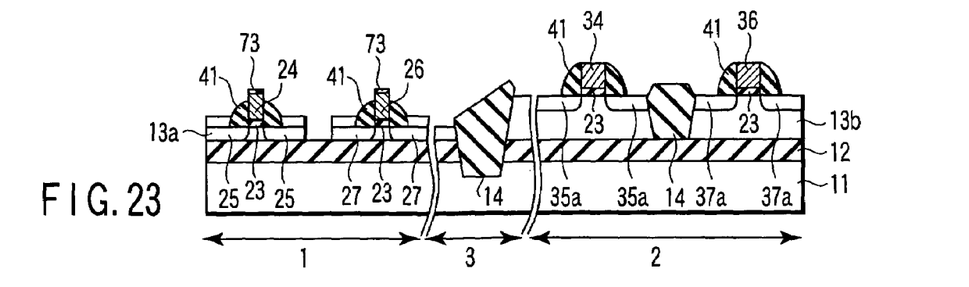
Figure 24:
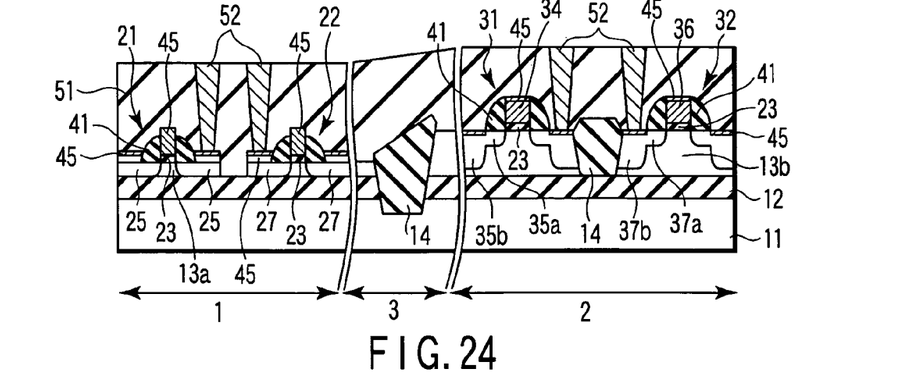

A second method is to etch the upper part of the sidewall insulating film 41 in the memory cell region 1 by, for example, dry etching, such as RIE, or wet etching after the step of FIG. 15 as shown in FIG. 23. As a result, the top of each of the first and second gate electrodes 24, 26 is exposed. Next, as shown in FIG. 18, the step of turning into silicide is carried out. At this time, the exposed parts of the first and second gate electrodes 24, 26 also start to be turned into silicide. Accordingly, only the whole of the first and second gate electrodes 24, 26 are turned into silicide. In the second method, the finished semiconductor device is such that the sidewall insulating film 41 (a second sidewall insulating film) in the memory cell region 1 is lower in height than the sidewall insulating film 41 (a first sidewall insulating film) in the peripheral region 2 as shown in FIG. 24.

A third method is to implant ions of, for example, germanium or silicon, into the third and fourth gate electrodes 34, 36 before the step of turning into silicide of FIG. 18. Moreover, arsenic may be used for the third gate electrode 34. As a result, the part into which ions have been implanted is made preamorphous. This prevents the whole third and fourth gate electrodes 34, 36 from being turned into silicide. When it is difficult to turn only the whole of the first and second gate electrodes 24, 26 into silicide by only any one of the first to third methods, these methods may be combined suitably.

The semiconductor device of the fifth embodiment produces the same effect as the first embodiment. In the fifth embodiment, the whole first and second gate electrodes 24, 26 are turned into silicide. Selecting suitably a reactive material for forming silicide enables the first and second gate electrodes 24, 26 turned into silicide to be made of various materials. This makes it easier to set the threshold voltages of the first and second gate electrodes 24, 26 in a diverse range of voltage.

Furthermore, in the fifth embodiment, the threshold values of the first and second gate electrodes 24, 26 can be adjusted by turning the first and second gate electrodes 24, 26 into silicide. Consequently, it is possible to set the threshold values of the first and second gate electrodes 24, 26 without increasing the number of steps seriously.

(Sixth Embodiment)

In a sixth embodiment of the present invention, the memory cell transistors 21, 22 have a three-dimensional structure called Fin FET.

Figure 25:
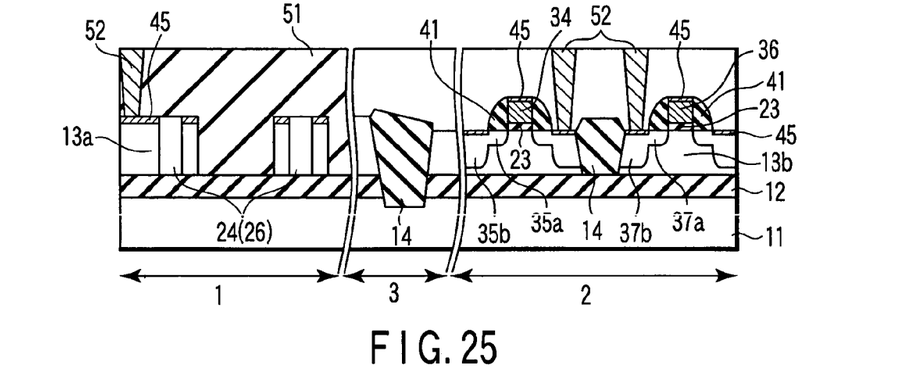
FIG. 25 is a schematic sectional view of a semiconductor device according to a sixth embodiment of the present invention.
Figure 26:
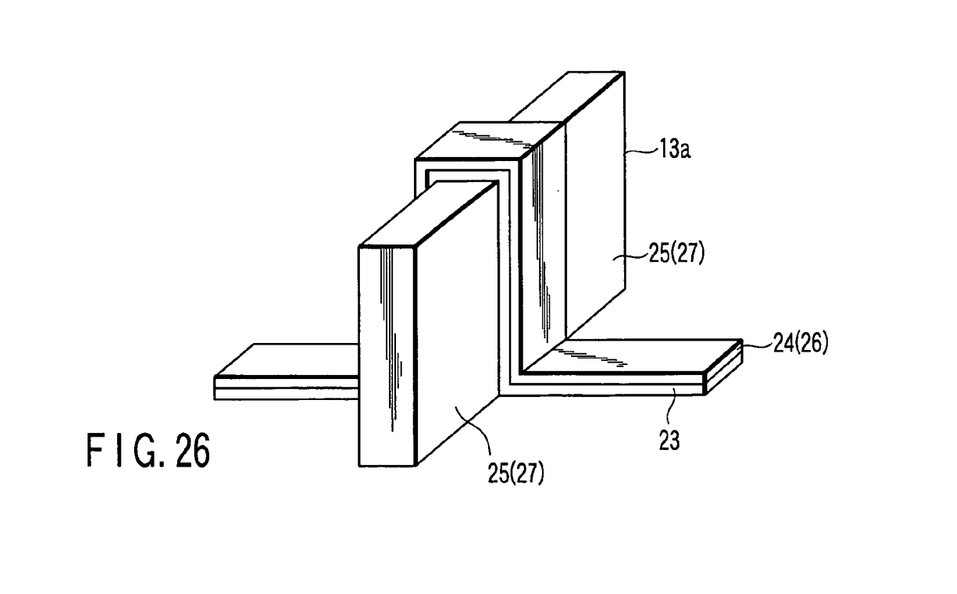
FIG. 26 is a schematic perspective view of a part of FIG. 25.

FIG. 25 is a schematic sectional view of a semiconductor device according to the sixth embodiment. FIG. 26 is a schematic perspective view of only the memory cell transistor 21 (22). FIG. 25 corresponds to a structure viewed from the side of the structure in FIG. 26.

As shown in FIGS. 25 and 26, in the memory cell region 1, the semiconductor layer 13a is in the form of a rectangular parallelepiped. The first gate electrode 24 (second gate electrode 26), which is in the form of a plane, extends on a first side of the semiconductor layer 13a, the top, and a second side of the semiconductor layer 13a facing the first side. In the region not covered with the first gate electrode 24 in the semiconductor layer 13a, a first source/drain diffusion layer 25 (a second source/drain diffusion layer 27) is formed. The part between the first source/drain diffusion layers 25 functions as a channel region.

In the semiconductor device of the sixth embodiment, the memory cell transistors 21, 22 have a three-dimensional structure and the peripheral transistors 31, 32 are of the partially-diffused type. In the three-dimensional-structure memory cell transistors 21, 22, the whole semiconductor layer 13a excluding the source/drain region is depleted as in the SOI structure of the fully-depleted type. As a result, the same effect as that of the first embodiment is obtained.

Figure 27:
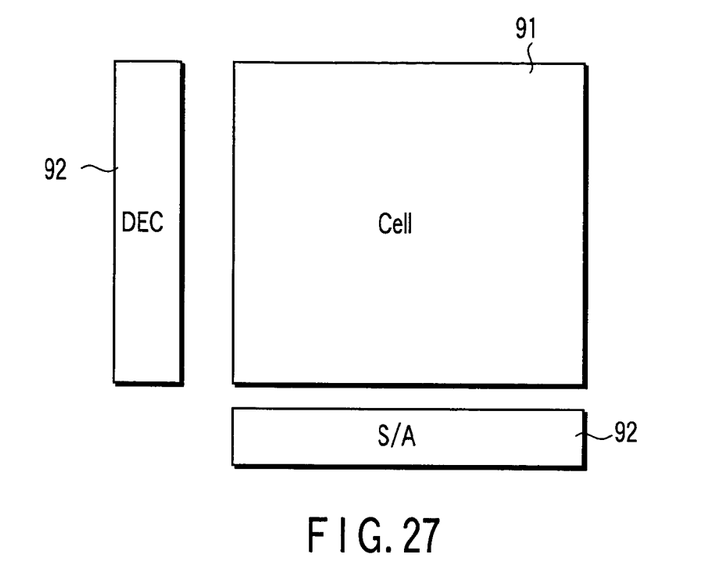
FIG. 27 is a schematic block diagram of an SRAM.

In the first to sixth embodiments, the explanation has been given, provided that the memory cell region 1 corresponds only to the part constituting the memory cells of an SRAM. That is, the memory cell region 1 corresponds to a memory cell array 91 in FIG. 27 and the peripheral circuit region 2 corresponds to a peripheral part 92, including a decoder and a sense amplifier. This invention is not limited to this. This will be explained briefly.

Figure 28:
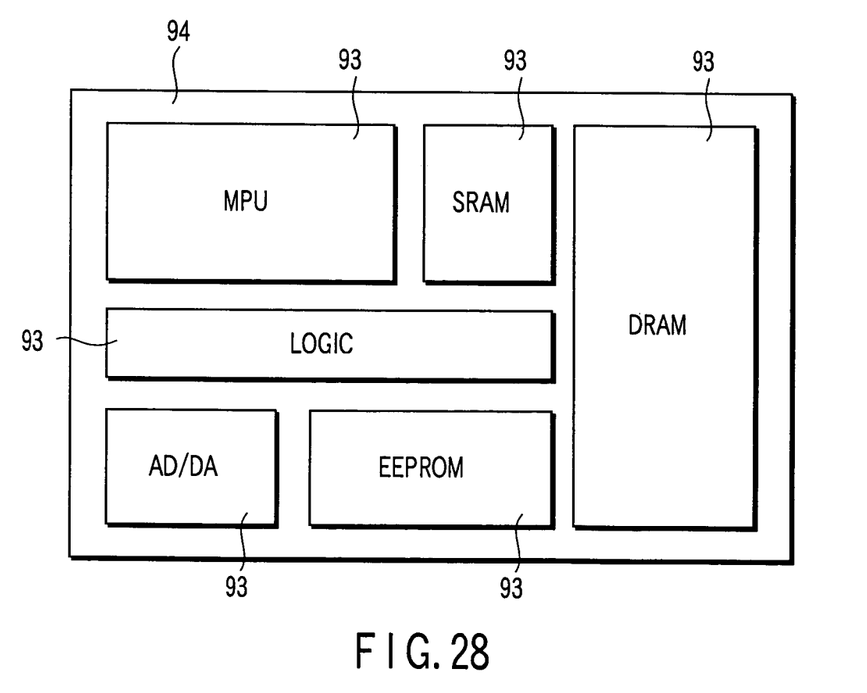
FIG. 28 is a schematic block diagram of a system LSI.

One known system LSI (Large Scale Integrated Circuit) is such that memories and logics are squeezed into a system chip to form a system. In the system LSI, a plurality of function blocks 93 (cores, macros, and IP (Intellectual property)), including a DRAM (Dynamic Random Access Memory) circuit DRAM and a logic circuit LOGIC, are provided on a semiconductor chip 94 as shown in FIG. 28. A desired system as a whole is constructed of these macros 93. In the case of the SRAM 93, peripheral circuits (for example, a sense amplifier and a decoder) necessary for the operation of the memory are formed in one macro 93 in addition to the memory cell array. Then, because of a limitation on the design and the easiness of formation, the peripheral circuit section is also formed with a pitch as narrow as that of the memory cell array. As a result, the impurity concentration varies and soft errors also occur in the transistors of the peripheral circuit section. To overcome this problem, the transistors not only in the memory cell section but also in the peripheral circuit section are made the fully-depleted type in the case of memory macros. By doing this, the problem can be avoided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
an insulating film provided on a support substrate;
a first semiconductor layer provided on the insulating film;
a first memory cell transistor constituting a part of a memory cell in an SRAM, having a first gate electrode of a first conductivity type on a gate insulating film on the first semiconductor layer and first source/drain diffusion layers of a second conductivity type opposite to the first conductivity type which sandwich a region under the first gate electrode in the first semiconductor layer, and fulfilling an expression such as the thickness of the first semiconductor layer≦one-third of a length of the first gate electrode in its channel length direction;
a second semiconductor layer provided on the insulating film; and
a first peripheral transistor constituting a part of a peripheral circuit, having a third gate electrode on a gate insulating film on the second semiconductor layer and third source/drain diffusion layers which sandwich a region under the third gate electrode in the second semiconductor layer, and fulfilling an expression such as the thickness of the second semiconductor layer>one-third of a length of the third gate electrode in its channel length direction.

2. The device according to claim 1, wherein the first and third gate electrodes consist essentially of $Si_XGe_{1-X}$ ($0≦X≦1$).

3. The device according to claim 1, further comprising a second memory cell transistor which constitutes a part of the memory cell in the SRAM, has a second gate electrode of the second conductivity type on a gate insulating film on the first semiconductor layer and second source/drain diffusion layers of the first conductivity type sandwiching a region under the second gate electrode in the first semiconductor layer, and fulfills an expression such as the thickness of the first semiconductor layer≦one-third of a length of the second gate electrode in its channel length direction.

4. The device according to claim 3, wherein the third source/drain diffusion layer and the third gate electrode are of the same conductivity type.

5. The device according to claim 4, further comprising a second peripheral transistor which constitutes a part of the peripheral circuit, has a fourth gate electrode on a gate insulating film on the second semiconductor layer and fourth source/drain diffusion layers sandwiching a region under the fourth gate electrode in the second semiconductor layer, and fulfills an expression such as the thickness of the second semiconductor layer>one-third of a length of the fourth gate electrode in its channel length direction.

6. The device according to claim 5, wherein the fourth source/drain diffusion layers and the fourth gate electrode are of the same conductivity type.

7. The device according to claim 5, wherein the first, second, third, and fourth gate electrodes consist essentially of $Si_XGe_{1-X}$ ($0≦X≦1$).

8. The device according to claim 1, wherein 90% or more of the volume of the first gate electrode consists of silicide.

9. The device according to claim 8, wherein the third gate electrode has silicide on only a part of its upper part.

10. The device according to claim 9, wherein the first gate electrode has a volume equal to 80% or less of the volume of the third gate electrode.

11. The device according to claim 8, further comprising a sidewall insulating film provided on the sidewall of the first gate electrode excluding its upper part.

12. The device according to claim 8, further comprising:
a first sidewall insulating film provided on the sidewall of the third gate electrode; and
a second sidewall insulating film provided on the sidewall of the first gate electrode and having an upper end lower than the upper end of the first sidewall insulating film.

13. A semiconductor device comprising:
a semiconductor substrate;
an insulating film provided on the semiconductor substrate;
a semiconductor layer provided on the semiconductor substrate;
a first memory cell transistor constituting a part of a memory cell in an SRAM, having a first gate electrode of a first conductivity type on a gate insulating film on the semiconductor layer and first source/drain diffusion layers of a second conductivity type opposite to the first conductivity type which sandwich a region under the first gate electrode in the semiconductor layer, and fulfilling an expression such as the thickness of the semiconductor layer≦one-third of a length of the first gate electrode in its channel length direction; and
a first peripheral transistor constituting a part of a peripheral circuit, having a third gate electrode on a gate insulating film on the semiconductor substrate and third source/drain diffusion layers which sandwich a region under the third gate electrode in the semiconductor substrate.

14. The device according to claim 13, wherein the first and third gate electrodes consist essentially made of $Si_XGe_{1-X}$ ($0 \leq X \leq 1$).

15. The device according to claim 13, further comprising a second memory cell transistor which constitutes a part of the memory cell in the SRAM, has a second gate electrode of the second conductivity type on a gate insulating film on the semiconductor layer and second source/drain diffusion layers of the first conductivity type which sandwich a region under the second gate electrode in the semiconductor layer, and fulfills an expression such as the thickness of the semiconductor layer≦one-third of a length of the second gate electrode in its channel length direction.

16. The device according to claim 15, wherein the third source/drain diffusion layers and the third gate electrode are of the same conductivity type.

17. The device according to claim 16, further comprising a second peripheral transistor which constitutes a part of the peripheral circuit, has a fourth gate electrode on a gate insulating film on the semiconductor substrate and fourth source/drain diffusion layers which sandwich a region under the fourth gate electrode in the semiconductor substrate.

18. The device according to claim 17, wherein the fourth source/drain diffusion layers and the fourth gate electrode are of the same conductivity type.

19. The device according to claim 17, wherein the first, second, third, and fourth gate electrodes consist essentially of $Si_XGe_{1-X}$ ($0 \leq X \leq 1$).

20. The device according to claim 13, wherein 90% or more of the volume of the first gate electrode consists of silicide.

21. The device according to claim 20, wherein the third gate electrode has silicide on only a part of its upper part.

22. The device according to claim 21, wherein the first gate electrode has a volume equal to 80% or less of the volume of the third gate electrode.

23. The device according to claim 20, further comprising a sidewall insulating film provided on the sidewall of the first gate electrode excluding its upper part.

24. The device according to claim 20, further comprising:
a first sidewall insulating film provided on the sidewall of the third gate electrode; and
a second sidewall insulating film provided on the sidewall of the first gate electrode and having an upper end lower than the upper end of the first sidewall insulating film.

25. A semiconductor device comprising:
an insulating film provided on a support substrate;
a first semiconductor layer provided on the insulating film;
a first memory cell transistor constituting a part of a memory cell in an SRAM, having a first gate electrode consisting essentially of a metal material on a gate insulating film on the first semiconductor layer and first source/drain diffusion layers which sandwich a region under the first gate electrode in the first semiconductor layer, and fulfilling an expression such as the thickness of the first semiconductor layer≦one-third of a length of the first gate electrode in its channel length direction;
a second semiconductor layer provided on the insulating film; and
a first peripheral transistor constituting a part of a peripheral circuit, having a third gate electrode on a gate insulating film on the second semiconductor layer and third source/drain diffusion layers which sandwich a region under the third gate electrode in the second semiconductor layer, and fulfilling an expression such as the thickness of the second semiconductor layer>one-third of a length of the third gate electrode in its channel length direction.

26. The device according to claim 25, wherein the first gate electrode consists essentially of a material selected from a group consisting of tungsten, titanium, molybdenum, nickel, cobalt, platinum, and an alloy of these metals.

27. A semiconductor device comprising:
a semiconductor substrate;
an insulating film provided on the semiconductor substrate;
a semiconductor layer provided on the semiconductor substrate;
a first memory cell transistor constituting a part of a memory cell in an SRAM, having a first gate electrode consisting essentially of a metal material on a gate insulating film on the first semiconductor layer and first source/drain diffusion layers which sandwich a region under the first gate electrode in the semiconductor layer, and fulfilling an expression such as the thickness of the semiconductor≦layer one-third of a length of the first gate electrode in its channel length direction; and
a first peripheral transistor constituting a part of a peripheral circuit, having a third gate electrode on a gate insulating film on the semiconductor substrate and third source/drain diffusion layers which sandwich a region under the third gate electrode in the semiconductor substrate.

28. The device according to claim 27, wherein the first gate electrode consists essentially of a material selected from a group consisting of tungsten, titanium, molybdenum, nickel, cobalt, platinum, and an alloy of these metals.

29. A semiconductor device comprising:

an insulating film provide on a support substrate;

a first semiconductor layer provided on the insulating film and having a first surface, a second surface opposite to the first surface and a third surface contacting the first surface and the second surface;

a first memory cell transistor constituting a part of a memory cell in an SRAM and having a first gate electrode and first source/drain diffusion layers, the first gate electrode being provided on a gate insulating film which is provided on the first surface, on the second surface and on the third surface of the first semiconductor layer, the first source/drain diffusion layers sandwiching a region enclosed by the first gate electrode in the first semiconductor layer;

a second semiconductor layer provided on the insulating film; and a first peripheral transistor constituting a part of a peripheral circuit, having a third gate electrode on a gate insulating film on the second semiconductor layer and third source/drain diffusion layers which sandwich a region under the third gate electrode in the second semiconductor layer, and fulfilling an expression such as the thickness of the second semiconductor layer>one-third of a length of the third gate electrode in its channel length direction.

* * * * *